(12) United States Patent
Xu et al.

(10) Patent No.: US 11,049,940 B2
(45) Date of Patent: Jun. 29, 2021

(54) METHOD AND STRUCTURE FOR FORMING SILICON GERMANIUM FINFET

(71) Applicant: INTERNATIONAL BUSINESS MACHINES CORPORATION, Armonk, NY (US)

(72) Inventors: Peng Xu, Sunnyvale, CA (US); Kangguo Cheng, Schenectady, NY (US); Juntao Li, Cohoes, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/509,032

(22) Filed: Jul. 11, 2019

(65) Prior Publication Data
US 2019/0333996 A1    Oct. 31, 2019

Related U.S. Application Data

(62) Division of application No. 15/861,167, filed on Jan. 3, 2018, now Pat. No. 10,411,094.

(51) Int. Cl.
| | |
|---|---|
| *H01L 29/10* | (2006.01) |
| *H01L 29/66* | (2006.01) |
| *H01L 29/06* | (2006.01) |
| *H01L 29/78* | (2006.01) |
| *H01L 29/165* | (2006.01) |

(Continued)

(52) U.S. Cl.
CPC .... *H01L 29/1054* (2013.01); *H01L 21/02532* (2013.01); *H01L 21/308* (2013.01);
(Continued)

(58) Field of Classification Search
CPC ..... H01L 21/823431; H01L 21/823821; H01L 21/845; H01L 21/306–30621;
(Continued)

(56) References Cited

U.S. PATENT DOCUMENTS

| | | |
|---|---|---|
| 7,307,273 B2 | 12/2007 | Currie |
| 7,335,545 B2 | 2/2008 | Currie |

(Continued)

OTHER PUBLICATIONS

Witters, L. et al., "Strained Germanium Gate-All-Around pMOS Device Demonstration Using Selective Wire Release Etch Prior to Replacement Metal Gate Deposition" IEEE Transactions on Electron Devices (Nov. 2017) pp. 4587-4593, vol. 64, No. 11.

(Continued)

*Primary Examiner* — Sonya McCall-Shepard
(74) *Attorney, Agent, or Firm* — Tutunjian & Bitetto, P.C.; Randall Bluestone

(57) ABSTRACT

A method of a forming a plurality of semiconductor fin structures that includes forming a sacrificial gate structure on a hardmask overlying a channel region portion of the plurality of sacrificial fins of a first semiconductor material and forming source and drain regions on opposing sides of the channel region. The sacrificial gate structure and the sacrificial fin structure are removed. A second semiconductor material is formed in an opening provided by removing the sacrificial gate structure and the sacrificial fin structure. The second semiconductor material is etched selective to the hardmask to provide a plurality of second semiconductor material fin structures. A function gate structure is formed on the channel region.

13 Claims, 10 Drawing Sheets

(51) Int. Cl.
*H01L 29/423* (2006.01)
*H01L 21/02* (2006.01)
*H01L 21/308* (2006.01)
*H01L 21/762* (2006.01)
*H01L 21/3065* (2006.01)
*H01L 21/467* (2006.01)

(52) U.S. Cl.
CPC ........ *H01L 21/3065* (2013.01); *H01L 21/467* (2013.01); *H01L 21/76224* (2013.01); *H01L 29/0653* (2013.01); *H01L 29/165* (2013.01); *H01L 29/6681* (2013.01); *H01L 29/66545* (2013.01); *H01L 29/66795* (2013.01); *H01L 29/7851* (2013.01)

(58) Field of Classification Search
CPC ..... H01L 21/3063–3065; H01L 21/308–3088; H01L 21/461; H01L 21/465; H01L 21/467; H01L 21/475; H01L 29/66795–66818; H01L 29/41791; H01L 29/785–786; H01L 2029/7857–7858; H01L 29/66568–66636; H01L 27/0886; H01L 27/0924; H01L 27/10826; H01L 27/10879; H01L 27/1211
See application file for complete search history.

(56) References Cited

U.S. PATENT DOCUMENTS

| | | | |
|---|---|---|---|
| 8,106,381 | B2 | 1/2012 | Atanackovic |
| 8,334,184 | B2 | 12/2012 | Steigerwald et al. |
| 8,445,340 | B2 | 5/2013 | Lee et al. |
| 8,859,389 | B2 | 10/2014 | Kawasaki et al. |
| 8,975,125 | B2 | 3/2015 | Adam et al. |
| 9,379,219 | B1 | 6/2016 | Kerber et al. |
| 9,515,185 | B2 | 12/2016 | Liu et al. |
| 9,685,380 | B2 | 6/2017 | Loubet et al. |
| 2009/0236595 | A1 | 9/2009 | Atanackovic |
| 2012/0161238 | A1* | 6/2012 | Scheiper ......... H01L 21/823412 257/368 |
| 2013/0020707 | A1 | 1/2013 | Or-Bach et al. |
| 2014/0027860 | A1 | 1/2014 | Glass et al. |
| 2016/0190303 | A1 | 6/2016 | Liu et al. |
| 2017/0162694 | A1* | 6/2017 | Basker ............ H01L 21/823821 |

OTHER PUBLICATIONS

List of IBM Patents or Patent Applications Treated as Related dated Jul. 11, 2019, 2 pages.

* cited by examiner

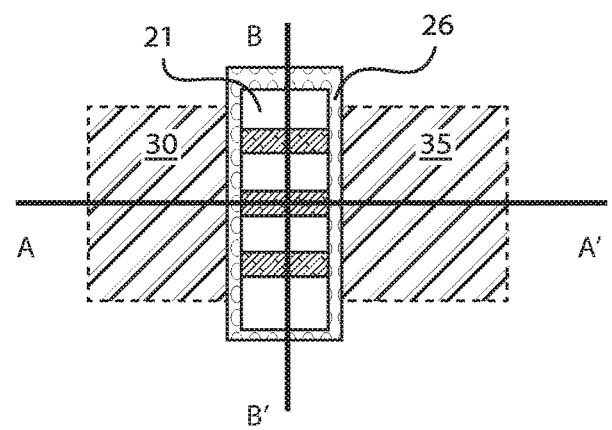
FIG. 12A
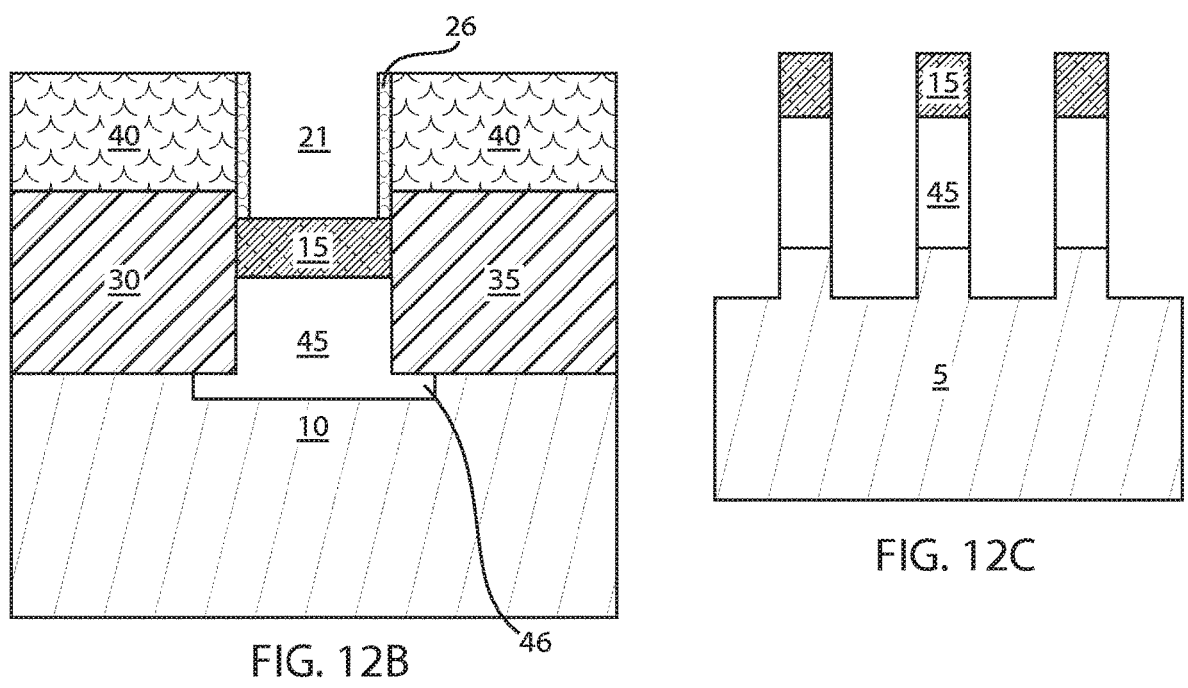
FIG. 12B
FIG. 12C

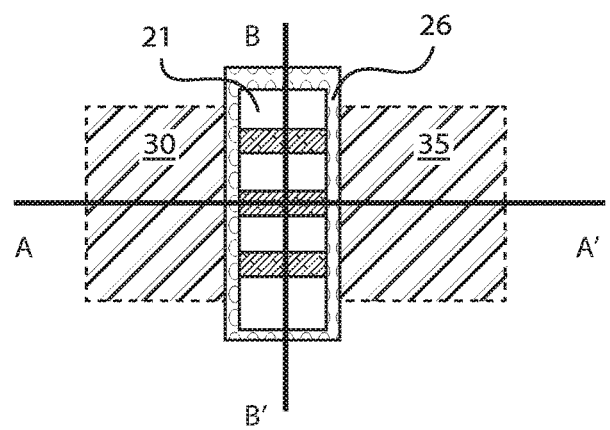
FIG. 13A
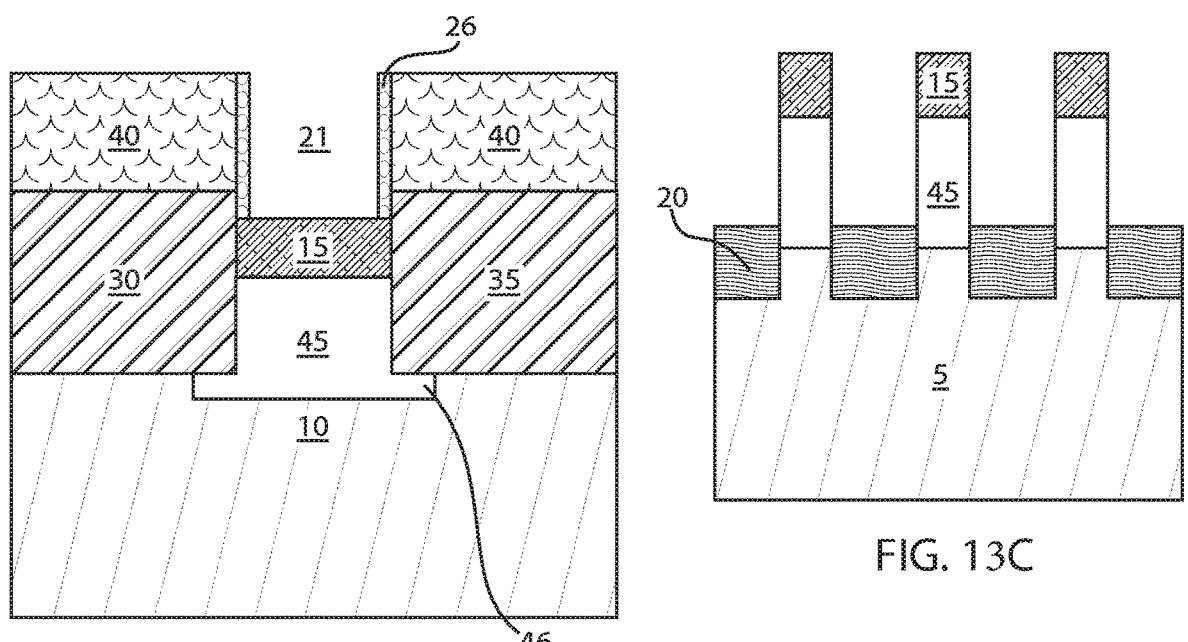
FIG. 13B
FIG. 13C

METHOD AND STRUCTURE FOR FORMING SILICON GERMANIUM FINFET

BACKGROUND

Technical Field

The present invention relates to semiconductor devices, and more particularly to semiconductor devices including fin structures.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one embodiment, a method of a forming a plurality of semiconductor fin structures is described that includes forming a sacrificial gate structure on a hardmask overlying a channel region portion of a plurality of sacrificial fins of a first semiconductor material, in which isolation regions are present at the base of the plurality of sacrificial fins. The method may continue with forming source and drain regions on opposing sides of the channel region portion of the plurality of sacrificial fins; and removing the sacrificial gate structure and the sacrificial fin structure selectively to the hardmask. A second semiconductor material is formed in an opening provided by removing the sacrificial gate structure and the sacrificial fin structure. The second semiconductor material is etched selectively to the hardmask to provide a plurality of second semiconductor material fin structures. A functional gate structure is formed on a channel region portion of the plurality of second semiconductor material fin structures.

In another embodiment, a method of a forming a plurality of semiconductor fin structures is described that includes forming a sacrificial gate structure on a hardmask overlying a channel region portion of a plurality of sacrificial fins of a first semiconductor material, in which isolation regions are present at the base of the plurality of sacrificial fins. The method may continue with forming source and drain regions on opposing sides of the channel region portion of the plurality of sacrificial fins; and removing the sacrificial gate structure and the sacrificial fin structure selectively to the hardmask. A second semiconductor material is formed in an opening provided by removing the sacrificial gate structure and the sacrificial fin structure. The second semiconductor material is etched selectively to the hardmask to provide a plurality of second semiconductor material fin structures. A functional gate structure is formed on a channel region portion of the plurality of second semiconductor material fin structures.

In another embodiment, a semiconductor device is provided including a silicon and germanium containing fin structure epitaxially present atop a silicon substrate, wherein a base of the silicon germanium fin structure includes lateral extensions. A gate structure is present on a channel portion of the silicon and germanium containing fin structure. In one embodiment, source and drain regions are present on opposing sides of the channel portion of the silicon and germanium containing fin structure. The lateral extensions of the silicon and germanium containing fin structure undercut an edge of the source and drain regions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 12A is a top down view depicting epitaxially growing a second semiconductor material in the opening provided by removing the sacrificial gate structure and the sacrificial fin structure, and etching the second semiconductor material selectively to the hardmask to provide a plurality of second semiconductor material fin structures.

FIG. 12B is a side cross-sectional view along section line A-A' in FIG. 12A.

FIG. 12C is a side cross-sectional view along section line B-B' in FIG. 12A.

FIG. 13A is a top down view depicting forming isolation regions between adjacent second semiconductor material fin structures.

FIG. 13B is a side cross-sectional view along section line A-A' in FIG. 13A.

FIG. 13C is a side cross-sectional view along section line B-B' in FIG. 13A.

DETAILED DESCRIPTION OF PREFERRED EMBODIMENTS

Figure 1A:
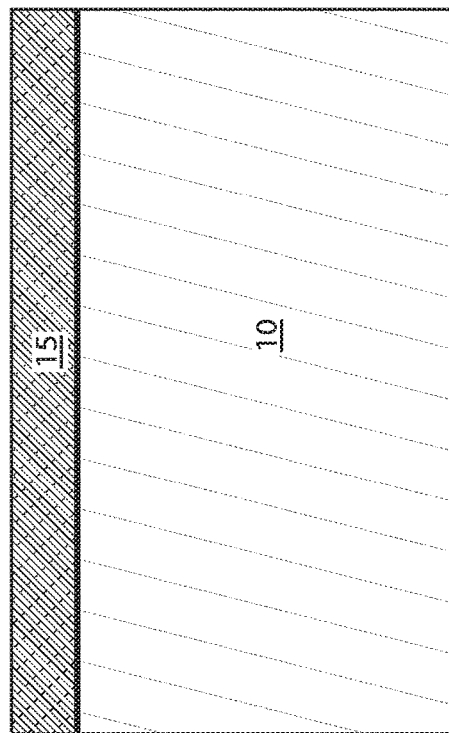
FIG. 1A is a top down view depicting one embodiment of forming fin structures from a first semiconductor material using a hardmask and an etch method, wherein isolation regions are formed between adjacent fin structures.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The fin structures disclosed herein may provide the active region, i.e., the source, drain and channel portions, of fin structures for Fin Field Effect Transistors (FinFET). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The structures and methods that are disclosed herein provide a method for providing a silicon germanium (SiGe) fin structure, such as a silicon germanium (SiGe) fin structure for use as a channel region in p-type field effect transistors (pFETs). Further, in electrical devices including multiple semiconductor devices, such as different conductivity types, i.e., n-type or p-type, FinFETs, isolation regions may be employed to provide for device isolation between the different conductivity type devices. The isolation regions, such as shallow trench isolation (STI) regions, may be formed on a substrate including the aforementioned fin structures. Stability of the shallow trench isolation region (STI) region can be advantageous for the device performance. Stability of the shallow trench isolation (STI) regions can be increased with high temperature annealing. If a silicon germanium (SiGe) fin structure, such as a silicon germanium (SiGe) fin structure for a MOSFET, is formed before the shallow trench isolation (STI) region, the thermal budget of the annealing to increase the quality of the STI can result in potential SiGe strain relaxation and defect formation.

The methods and structures described herein form channel regions of silicon germanium (SiGe), such as silicon germanium (SiGe) fin structures, late in the process flow to prevent from the thermal budget of the STI annealing process, which occurs early in the process flow, impacting the quality of the silicon germanium (SiGe). For example, in some embodiments, the methods provided herein form SiGe Fin structures after shallow trench isolation (STI) region formation to avoid defects and strain relaxation in the SiGe channel. In some embodiments, the methods provided herein form SiGe Fin structures after shallow trench isolation (STI) region formation and after source/drain junction formation, which is another high thermal budget process, to avoid defects and strain relaxation in the SiGe channel. The methods and structures of the present disclosure are now discussed with more detail referring to FIGS. 1A-8C.

In some embodiments, the method of forming the semiconductor device including the silicon germanium (SiGe) fin structures can begin with forming a sacrificial gate structure 25 on a hardmask 15 overlying a channel region portion of a plurality of sacrificial fin structures 10 of a first semiconductor material, as depicted in FIGS. 1A-2C. Isolation regions 20 are present at the base of the plurality of sacrificial fin structures 10.

Figure 1B:
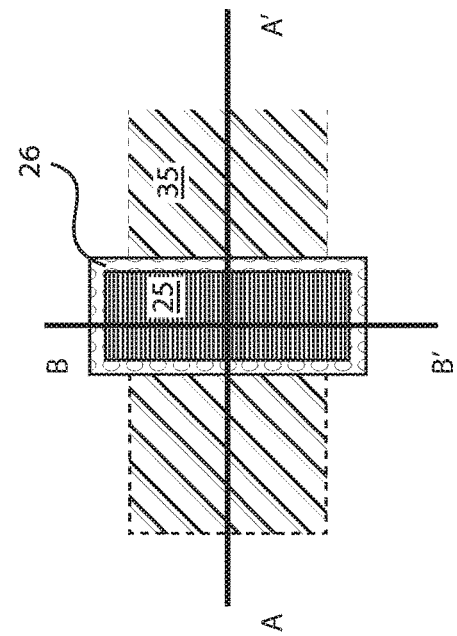
FIG. 1B is a side cross-sectional view along section line A-A' in FIG. 1A illustrating a cross section along a length of a fin structure.
Figure 1C:
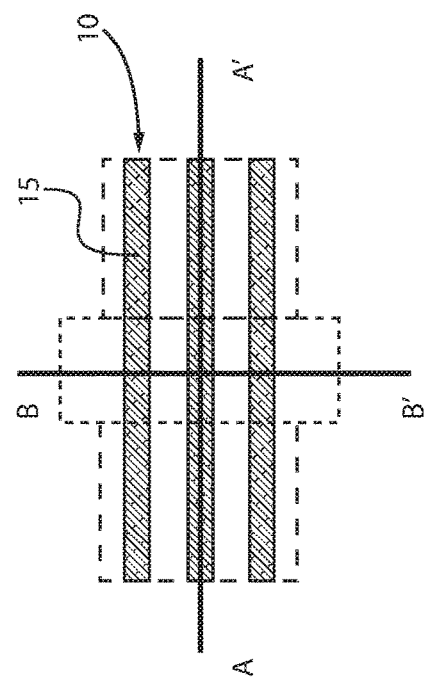
FIG. 1C is a side cross-sectional view along section line B-B' in FIG. 1A illustrate a cross section across the length of a plurality of fin structures.

FIGS. 1A-1C depict one embodiment of forming sacrificial fin structures 10 from a first semiconductor material using a hardmask 15 and an etch method, wherein isolation regions 20 are formed between adjacent sacrificial fin structures 10. In some embodiments, the plurality of sacrificial fin structures 10 may be composed of a type IV semiconductor, such as silicon (Si). In some embodiments, the plurality of sacrificial fin structures 10 may be formed from a bulk semiconductor substrate. The bulk semiconductor substrate, and subsequently the fin structures 5 that are formed therefrom, can be composed of a type IV semiconductor material. For example, the semiconductor material of the substrate 1, (as well as the sacrificial fin structures 10) may include, but is not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, and combinations thereof. In some other embodiments, the substrate may be composed of another semiconductor material besides a type IV semiconductor, such as a type III-V semiconductor material, such as gallium arsenic, indium arsenic, indium phosphide, as well as other III/V and II/VI compound semiconductors.

The plurality of sacrificial fin structures 10 may be formed deposition photolithography and etch processes. Alternatively, the sacrificial fin structures 10 can be formed by any other suitable patterning technique including but not limited to sidewall image transfer (SIT), self-aligned double patterning (SADP), self-aligned quadruple patterning (SAQP), self-aligned multiple patterning (SAMP). For example, forming the plurality of sacrificial fin structures 10 may include forming a dielectric layer (for forming a hardmask 15) on an upper surface of the substrate; etching the dielectric layer to form a hardmask 15; and then etching the substrate using the hardmask 15 with an anisotropic etch to a first depth to provide the sacrificial fin structures 10

The dielectric layer that provides the hardmask 15 may be composed of any dielectric layer or multiple layers that can function as an etch mask for etching the first semiconductor material, e.g., bulk semiconductor substrate, for forming the sacrificial fin structures 10. In some embodiments, the dielectric layer that provides the hardmask 15 may be composed of an oxide, nitride or oxynitride material. For example, when the sacrificial fin structures 10 being patterned are composed of silicon (Si), the dielectric layer that provides the hardmask 15 may be composed of silicon nitride, or a combination of multiple materials such as silicon nitride on top of a silicon oxide. The dielectric layer may be deposited using chemical vapor deposition (CVD), e.g., plasma enhanced chemical vapor deposition (PECVD). Other suitable deposition techniques include atomic layer deposition (ALD), physical vapor deposition (PVD).

The dielectric layer may be patterned using photolithography and etched to provide the geometry for the hard mask 15. More specifically, a photoresist etch mask may be formed overlying the portion of the dielectric layer that provides the hardmask 15, and then the exposed portions of the dielectric layer may be removed using an etch process, such as reactive ion etching (RIE). Alternatively, the sacrificial fin structures 10 can be formed by any other suitable patterning technique including but not limited to sidewall image transfer (SIT), self-aligned double patterning (SADP), self-aligned quadruple patterning (SAQP), self-aligned multiple patterning (SAMP).

In a following process step, the hard mask 15 protects the portions of the substrate, i.e., first semiconductor material, that provides the fin structures 10, while the exposed portions of the substrate that are not covered by the hard mask 15 are etched to form the trenches that separate the sacrificial fin structures 10. Similar to the etch process for patterning the hard mask 15, the etch process for forming the plurality of fin structures 10 may be an anisotropic etch, such as reactive ion etch (RIE), plasma etch, laser etching or a combinations thereof. The etch process removes the exposed portions of the substrate, i.e., first semiconductor material, selectively to the hard mask 15. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater.

The sacrificial fin structures 10 formed at this stage of the process flow may have a first height ranging from 5 nm to 200 nm. In another embodiment, each of the fin structures 10 has a first height ranging from 10 nm to 100 nm. In one example, each of the sacrificial fin structures 10 has a height ranging from 20 nm to 50 nm. Each of the plurality of sacrificial fin structures 10 may have a width ranging from 5 nm to 20 nm. In another embodiment, each of the sacrificial fin structures 10 has a width ranging from 5 nm to 15 nm. In one example, each sacrificial fin structures 10 has a width that is equal to 10 nm. The pitch separating adjacent sacrificial fin structures 10 may range from 10 nm to 50 nm. In another embodiment, the pitch 1 separating adjacent sacrificial fin structures may range from 20 nm to 45 nm. In one example, the pitch is equal to 30 nm. Although three sacrificial fin structures are depicted in FIG. 1A, the present disclosure is not limited to only this example. It is noted that any number of fin structures 10 may be formed from the semiconductor substrate.

Still referring to FIGS. 1A-1C, isolation regions, i.e., shallow trench isolation (STI) regions 20 may be formed between adjacent sacrificial fin structures 10 at the base of the sacrificial fin structures 10. For example, isolation regions may be formed by depositing a dielectric in the trench that is separating the adjacent sacrificial fin structures 10. The dielectric material for the isolation regions may be an oxide, such as silicon oxide. Other dielectric materials for the isolation regions may include nitride, such as silicon nitride, and/or silicon oxynitride materials, e.g., silicon oxynitride. The isolation regions may be formed using a chemical vapor deposition (CVD) process, such as plasma enhanced chemical vapor deposition (PECVD), metal organic chemical vapor deposition (MOCVD) and/or high density plasma chemical vapor deposition (HDPCVD). The height of the dielectric material for the shallow trench isolation (STI) regions 20 may be set using an etch process, such as reactive ion etching (RIE).

The dielectric material of the isolation region, e.g., shallow trench isolation (STI) region 20, may be densified to increase the quality of the isolation region using a high temperature anneal. For example, the anneal process may include an anneal temperature ranging from 400° C. to 1200° C. In some other examples, the anneal process may include an anneal temperature of approximately 900° C.

Figure 2A:
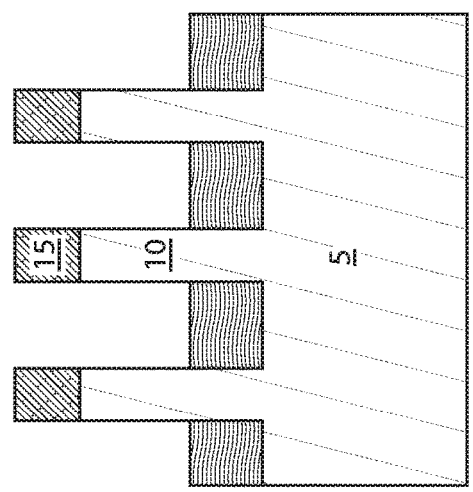
FIG. 2A is a top down view depicting one embodiment of forming a sacrificial gate structure on the channel region of the fin structures depicted in FIG. 1A, and forming source and drain regions on opposing sides of the channel region.
Figure 2B:
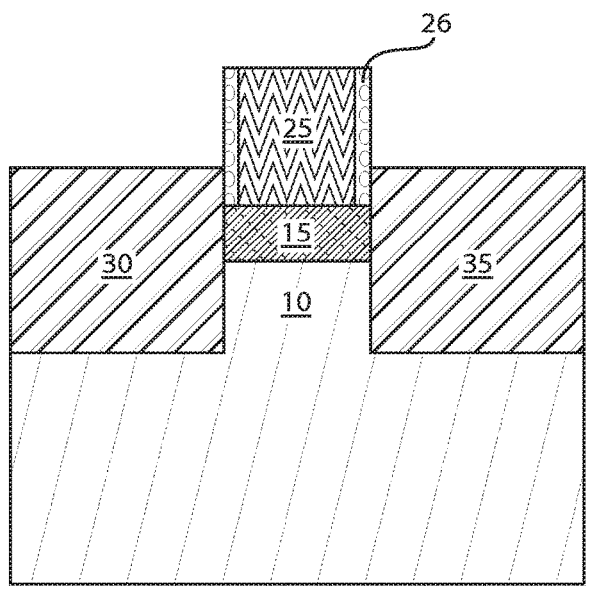
FIG. 2B is a side cross-sectional view along section line A-A' in FIG. 2A.
Figure 2C:
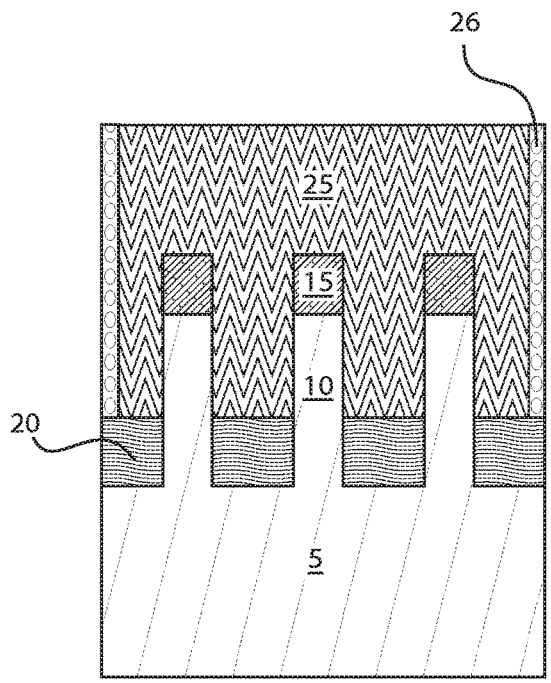
FIG. 2C is a side cross-sectional view along section line B-B' in FIG. 2A.

FIGS. 2A-2C depict one embodiment of forming a sacrificial gate structure 25 on the hardmask 15 that is present on the channel region of the sacrificial fin structures 10 depicted in FIG. 1A, and forming source and drain regions 30, 35 on opposing sides of the channel region.

FIGS. 2A-2C depicting forming a sacrificial gate structures 25 on the hardmask 15 that is present on an upper surface of the plurality of sacrificial fin structures 10. The term "sacrificial" as used to describe the sacrificial gate conductor 25 denotes that the structure is present during the process sequence, but is not present in the final device structure, in which the sacrificial structure provides an opening that dictates the size and geometry of a later formed functional gate structure. The sacrificial material that provides the replacement gate structure 25 may be composed of any material that can be etched selectively to the underlying hardmask 15 that is atop the sacrificial fin structure 10. In one embodiment, the sacrificial material that provides the sacrificial gate structure 25 may be composed of a dielectric, such as an oxide, nitride or oxynitride. The sacrificial gate structure 25 may also be composed of a semiconductor material, such as polysilicon.

The sacrificial material may be patterned and etched to provide the sacrificial gate structure 25. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the sacrificial material covered by the photoresist are protected to provide the sacrificial gate structure 25, while the exposed regions are removed using a selective etching process that removes the unprotected regions. Following formation of sacrificial gate structure 25, the photoresist may be removed. A dielectric spacer 26 may be present on a sidewall of the sacrificial gate structure 25. Still referring to FIGS. 2A-2C, source and drain regions 30, 35 may be formed on opposing sides of the channel region of the sacrificial fin structure 10. The source and drain regions 30, 35 may be composed of epitaxially formed and in situ doped semiconductor material.

The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In some embodiments, the epitaxial semiconductor material that provides the source and drain regions 30, 35 may be composed of silicon (Si), germanium (Ge), silicon germanium (SiGe), silicon doped with carbon (Si:C) or the epitaxial semiconductor material may be composed of a type III-V compound semiconductor, such as gallium arsenide (GaAs). The epitaxial semiconductor material may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

In the embodiments in which the finFET device being formed has n-type source and drain regions 30, 35, and is referred to as an n-type finFET, the doped epitaxial semiconductor material is doped with an n-type dopant to have an n-type conductivity. In the embodiments in which the finFET device being formed has p-type source and drain regions 30, 35, and is referred to as a p-type finFET, the doped epitaxial semiconductor material is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 3A:
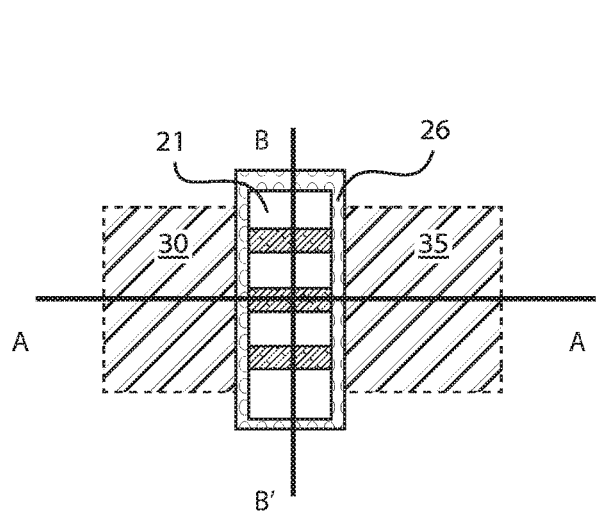
FIG. 3A is a top down view depicting one embodiment removing the sacrificial gate structure from the device structure depicted in FIG. 2A.
Figure 3B:
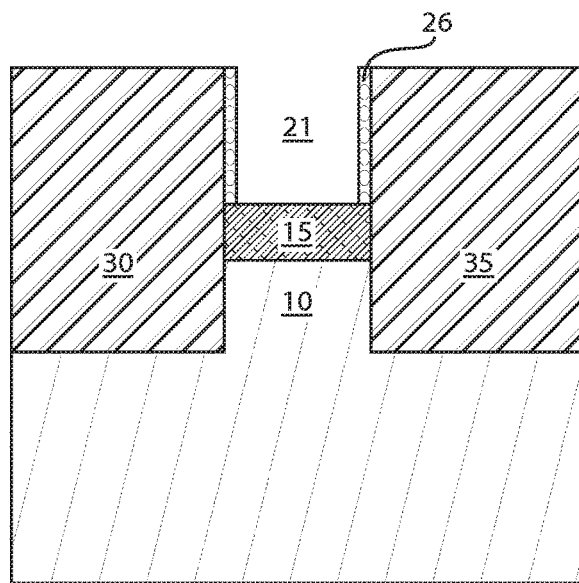
FIG. 3B is a side cross-sectional view along section line A-A' in FIG. 3A.

FIGS. 3A-3C depict one embodiment removing the sacrificial gate structure 25. In some embodiments, prior to removing the sacrificial gate structure 25, a dielectric layer 40 is deposited on at least the source and drain regions 30, 35, wherein the upper surface of the dielectric layer 40 is coplanar with the upper surface of the sacrificial gate structure 25. The dielectric layer 40 may be any non-crystalline material. For example, the dielectric 40 may be carbon based, such as amorphous carbon (α-C), or an oxide, such as porous silicon dioxide. It is noted that the above examples of the material compositions for the dielectric layer 40 have been provided for illustrative purposes only, and are not intended to limit the present disclosure.

The dielectric layer 40 may be formed by deposition, such as chemical vapor deposition, e.g., plasma enhanced chemical vapor deposition, or can be formed using a growth process, such as thermal oxidation. In some other embodiments, the dielectric layer 40 may be deposited using spin on deposition methods. In other embodiments, the dielectric layer 40 may be deposited using spin on deposition. To provide that the upper surface of the dielectric layer 40 is coplanar with the upper surface of the sacrificial gate structure 25, the deposited dielectric layer 40 is planarized using chemical mechanical planarization (CMP).

FIGS. 3A-3B depict removing the sacrificial gate structure 25 to provide an opening 21 through the dielectric layer 40 to the hardmask 15 that is present on the sacrificial fin structure 10. In some embodiments, the etch process for removing the sacrificial gate structure 25 to provide the opening 21 to the replacement fin structure 10 may be a selective etch process. For example, the etch process for forming the opening 21 may remove the material of the sacrificial gate structure 25 selectively to the dielectric material 40 and the dielectric spacer 26. In some embodiments, the etch process for recessing the exposed portion of the sacrificial gate structure 25 may also be selective to the sacrificial fin structure 10. As used herein, an "anisotropic etch process" denotes a material removal process in which the etch rate in the direction normal to the surface to be etched is greater than in the direction parallel to the surface to be etched. One anisotropic etch that can be used during this stage of the present process flow may be reactive ion etching (RIE). Other examples of anisotropic etching that can be used at this point of the present invention include ion beam etching, plasma etching or laser ablation. In other embodiments, the etch process for removing the sacrificial gate structure 25 may be an isotropic etch, such as a wet chemical etch. Or a combination of both isotropic and anisotropic etch processes.

Figure 4A:
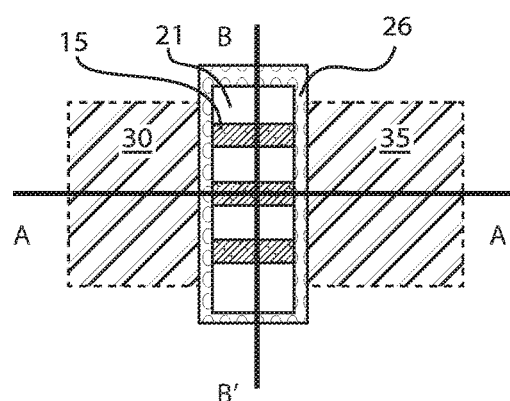
FIG. 4A is a top down view depicting isotropically etching the fin structures of the first semiconductor material.
Figure 4B:
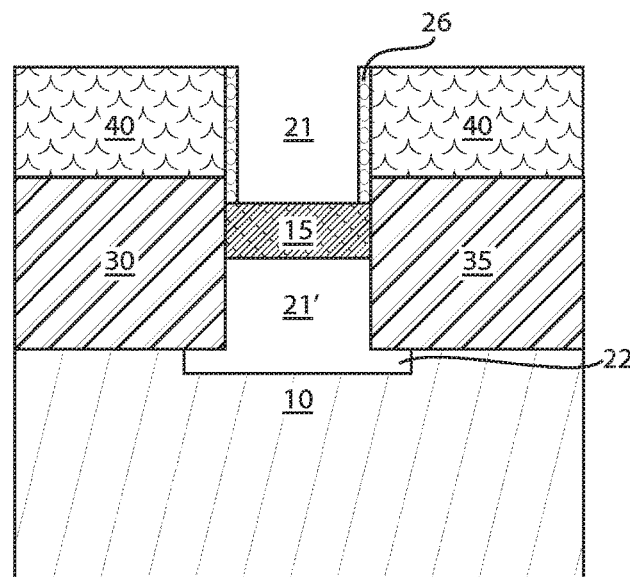
FIG. 4B is a side cross-sectional view along section line A-A' in FIG. 4A.
Figure 4C:
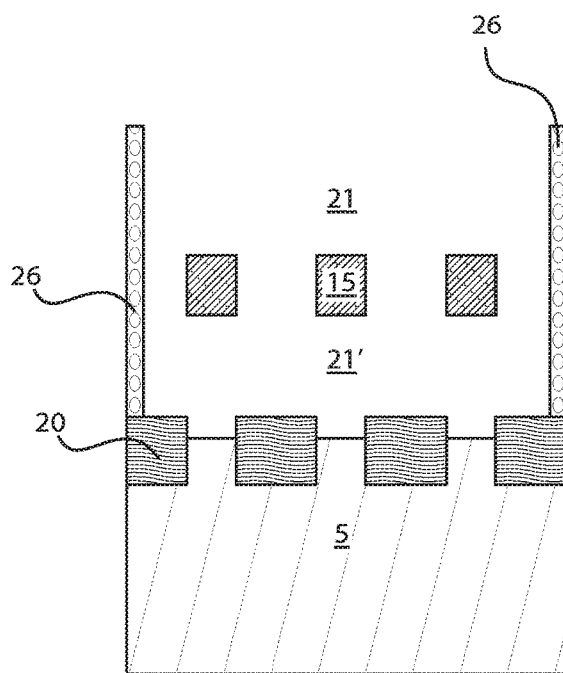
FIG. 4C is a side cross-sectional view along section line B-B' in FIG. 4A.
Figure 5A:
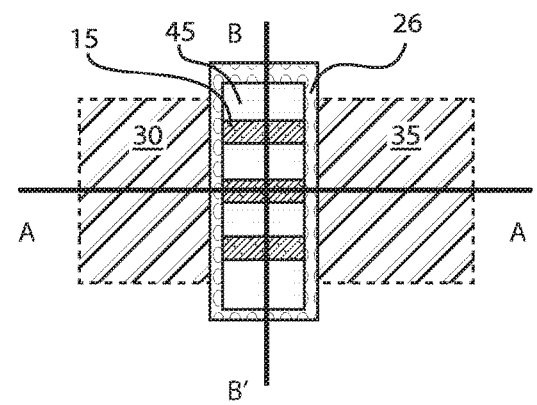
FIG. 5A is a top down view depicting epitaxially growing a second semiconductor material in the opening provided by removing the sacrificial gate structure and the sacrificial fin structure.
Figure 5B:
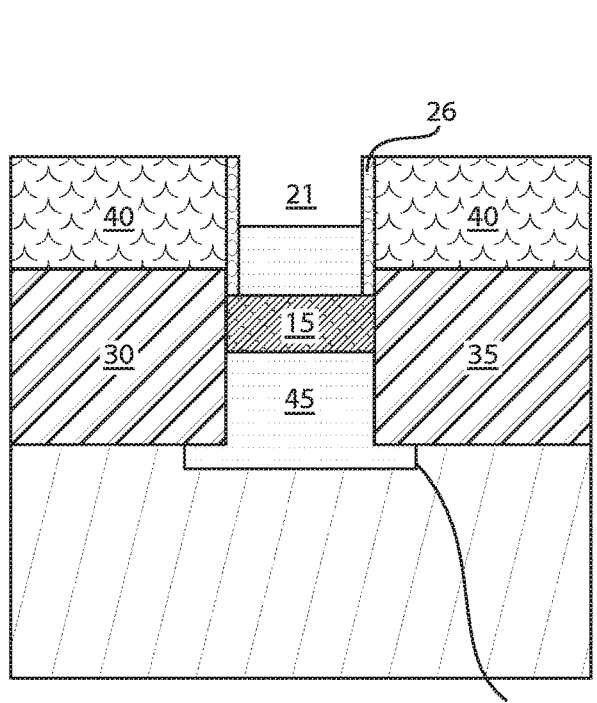
FIG. 5B is a side cross-sectional view along section line A-A' in FIG. 5A.
Figure 5C:
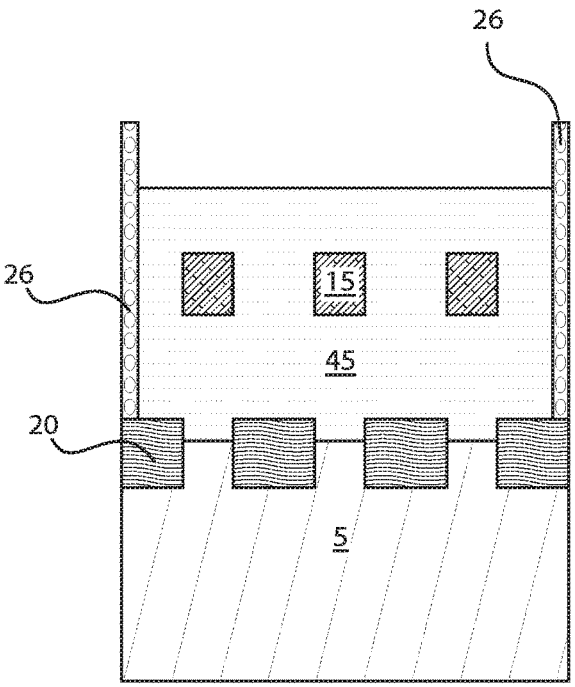
FIG. 5C is a side cross-sectional view along section line B-B' in FIG. 5A.

FIGS. 4A-4C depict removing the sacrificial fin structure 10 selectively to the dielectric layer 40 and the hardmask 15 to provide a fin opening 21'. In some embodiments, the etch process for removing the replacement fin structure 10 is an isotropic etch. By isotropic it is meant that the etch process is non-directional.

In some embodiments, the etch process for removing the sacrificial fin structure 10 and forming the fin opening 21' includes a lateral etching component in addition to a vertical, i.e., recessing, etching component. The isotropic etch can remove the entirety of the sacrificial fin structures 10, as well as a portion of the supporting portion of the semiconductor substrate 5. In some embodiments, by removing a portion of the semiconductor substrate 5 that is underlying the sacrificial fin structures 10, the isotropic etch produces a trench in the semiconductor substrate 5, which includes a notch portion 22 that is present undercutting the source and drain regions 30, 35.

The isotropic etch for removing the sacrificial fin structures 10 and forming the fin opening 21' may be a wet chemical etch. In other embodiments, the isotropic etch for removing the sacrificial fin structures 10 and forming the fin opening 21' may be a gas plasma etch. In some embodiments, the isotropic etch for forming the fin opening 25 may remove the semiconductor material, e.g., silicon, of the sacrificial fin structures 10 and the semiconductor substrate 5 selectively to the dielectric 20. The isotropic etch used at this stage of the process flow may also be selective to the remaining portion of the sacrificial gate structures 25.

FIGS. 5A-5D depict epitaxially growing functional fin structures 45 of a second semiconductor material on a growth surface provided by the semiconductor substrate 5 at the base of the fin opening 21'. The second semiconductor material that is being epitaxially grown substantially fills the gate opening 21, the fin opening 21', and the notch 22. The second semiconductor material may also encapsulate the hardmask 15. The epitaxial material, i.e., second semiconductor material, for the function fin structures 45 may be composed of a silicon and germanium containing semiconductor. For example, the second semiconductor material that is epitaxially grown for the functional fin structures 45 may be composed of silicon germanium (SiGe). In some embodiments, in which the second semiconductor material that is epitaxially grown for the functional fin structures 45 are composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

It is noted that the epitaxial deposition process that forms the second semiconductor material 45 fills the notch portion 22 of the opening. In some embodiments, this provides lateral extensions 46 of the silicon and germanium containing fin structure that undercut an edge of the source and drain regions 30, 35. The lateral extensions 46 may undercut the edge of the source and drain regions 30, 35 by a dimension ranging from 1 nm to 15 nm. In some embodiments, the lateral extensions 46 may undercut the edge of the source and drain regions 30, 35 by a dimension ranging from 1 nm to 10 nm. In yet another embodiment, the lateral extensions 46 may undercut the edge of the source and drain regions 30, 35 by a dimension ranging from 2 nm to 5 nm. In some embodiments, the epitaxy can overgrow above the top surface of ILD 40. A planarization process such as chemical mechanical polish (CMP) can be used to remove the epitaxy material above the ILD.

Figure 6A:
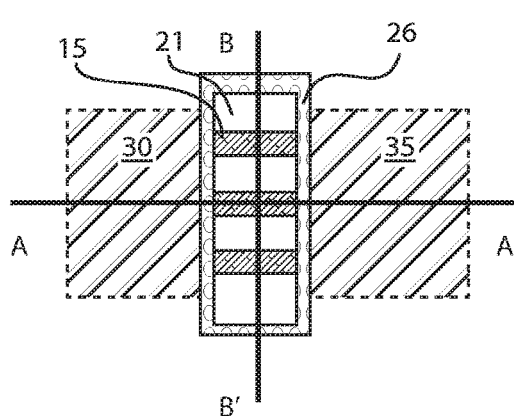
FIG. 6A is a top down view depicting etching the second semiconductor material selectively to the hardmask to provide a plurality of second semiconductor material fin structures.
Figure 6B:
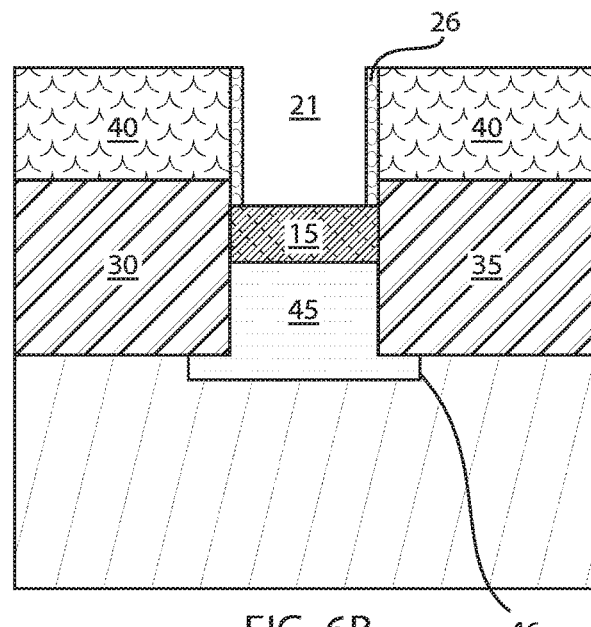
FIG. 6B is a side cross-sectional view along section line A-A' in FIG. 6A.
Figure 6C:
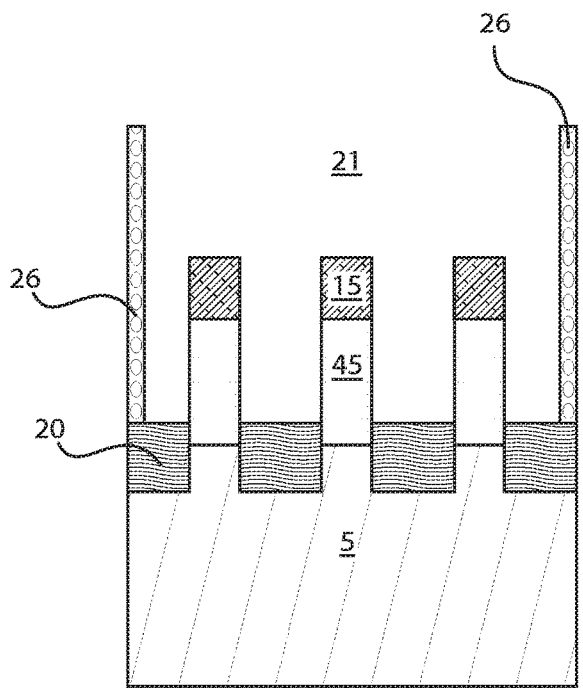
FIG. 6C is a side cross-sectional view along section line B-B' in FIG. 6A.

FIGS. 6A-6C depicting etching the second semiconductor material 45 selectively to the hardmask 15 to provide a plurality of second semiconductor material fin structures, i.e., for providing the functional fin structures 45. The etch process used at this stage of the process flow may be an anisotropic etch. The hardmask 15 provides the etch mask for dictating the geometry of the plurality of second semiconductor material fin structures, i.e., the functional fin structures 45. Therefore, because the hardmask 15 also dictated the geometry of the sacrificial fin structures 10, as described above with reference to FIGS. 1A-1C, the second semiconductor material fin structures, i.e., the functional fin structures 45, will have dimensions, i.e., height, width and pitch, that are the same as these dimensions for the sacrificial fin structures 10, which are provided above in the description of FIGS. 1A-1C.

One anisotropic etch that can be used during this stage of the present process flow may be reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

It is noted that the lateral extensions 46 remain in the device structure following this etch step.

Figure 7A:
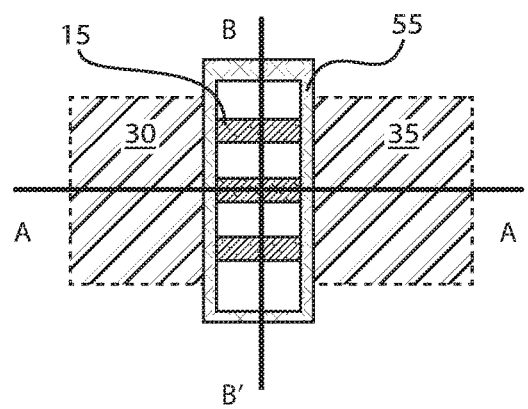
FIG. 7A is a top down view of forming gate sidewall spacer and forming a notch region underlying a portion of the gate sidewall spacers.
Figure 7B:
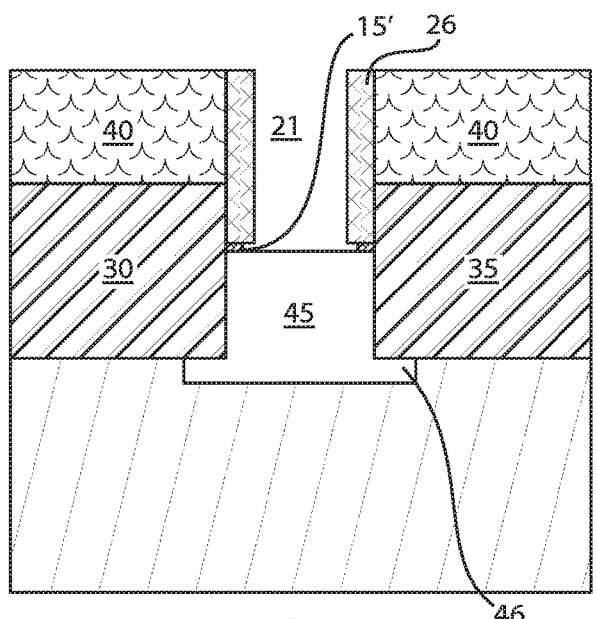
FIG. 7B is a side cross-sectional view along section line A-A' in FIG. 7A.
Figure 7C:
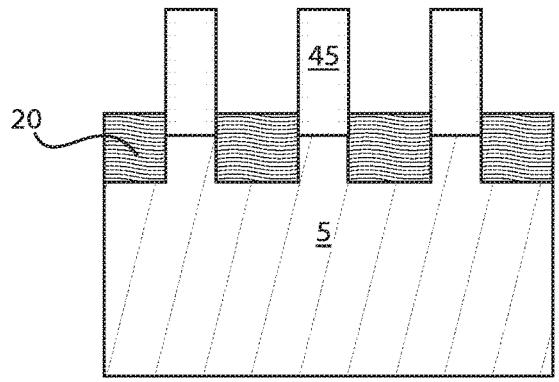
FIG. 7C is a side cross-sectional view along section line B-B' in FIG. 7A.

FIGS. 7A-7C depict forming gate sidewall spacers 55 and forming an undercut region 56 underlying a portion of the gate sidewall spacers 55. The process flow for forming the gate sidewall spacers 55 includes thinning the hardmask 15, forming a low-k gate sidewall spacer 55 on sidewalls of a gate opening atop a remaining portion of the hardmask 15', isotropically etching the remaining portion of the hardmask 15' to form the undercut region 56 underlying the low-k gate sidewall spacer 55.

Thinning the hardmask 15 may be accomplished with an etch process.

The low-k gate sidewall spacers 55 are formed using deposition and etch processes. A low-k dielectric material has a dielectric constant that is less than 7.0, e.g., less than 5.0. In one embodiment, the low-k material that provides the outer spacer layer 25 may have a dielectric constant ranging from 1.0 to 3.5. In another embodiment, the low-k material that provides the outer spacer layer 25 may have a dielectric constant ranging from 1.75 to 3.2. Some examples of materials that are suitable for the gate sidewall spacer 55 may include silicon boron carbon nitride (SiBCN), silicon oxycarbonitride (SiOCN), silicon carbonitride (SiCN), silicon oxycarbide (SiOC), silicon oxynitride (SiON), and/or silicon oxide Other low-k materials that may also be used for the low-k gate sidewall spacer 55 may include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer material for the low-k gate sidewall spacer may be conformally deposited on the sidewalls of the gate structure opening using atomic layer deposition (ALD), or chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

Following deposition, an etch process removes the horizontally orientated portions of the low-k dielectric material layer, wherein the remaining portions that are vertically orientated provide the low-k gate sidewall spacers 55. The etch process used at this stage of the process flow is an anisotropic etch, such as reactive ion etching.

A central portion of the thinned hardmask 15' that is not covered by the low-k gate sidewall spacers 55 remains exposed. The central portion of the thinned hardmask 15' is then etched with an isotropic etch to expose a channel region surface of the second semiconductor material fin structures, i.e., the functional fin structures 45. The isotropic etch may be provided by a wet chemical etch and/or a gas/plasma etch. The etch process for removing the exposed portion of the thinned hardmask 15' may be selective to the low-k gate sidewall spacers 55, as well as the second semiconductor material fin structures, i.e., the functional fin structures 45.

The isotropic etch process for removing the central portion of the thinned hardmask 15' also laterally etches the thinned hardmask 15' removing a portion that is underlying the low-k gate sidewall spacers 55. This provides an undercut region 56 underlying the low-k gate sidewall spacer 55. The undercut region 56 may undercut the interior edge of the low-k gate sidewall spacer 55 by a dimension ranging from 1 nm to 10 nm. In some embodiments, the undercut region 56 may undercut the interior edge of the low-k gate sidewall spacer 55 by a dimension ranging from 1 nm to 5 nm.

Figure 8A:
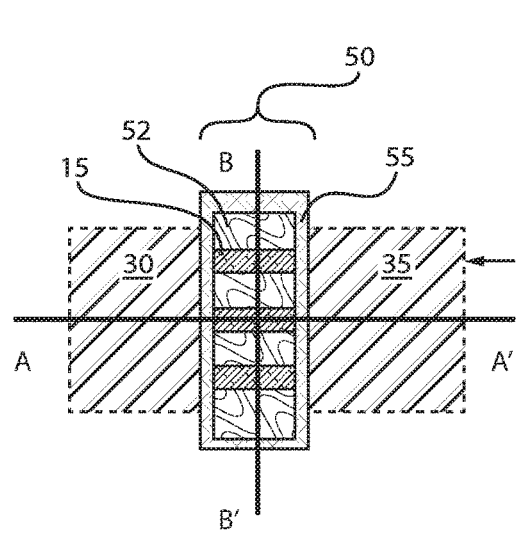
FIG. 8A is a top down view of forming a function gate structure for a FinFET device on the structure depicted in FIG. 7A.
Figure 8B:
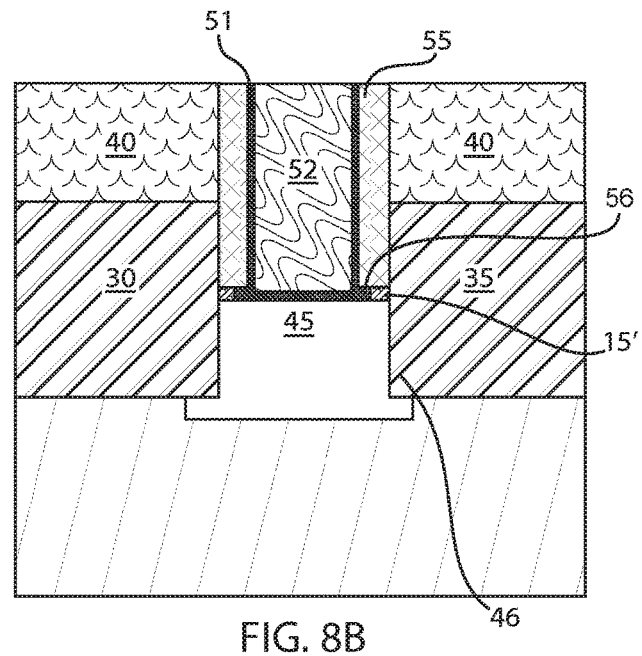
FIG. 8B is a side cross-sectional view along section line A-A' in FIG. 8A.
Figure 8C:
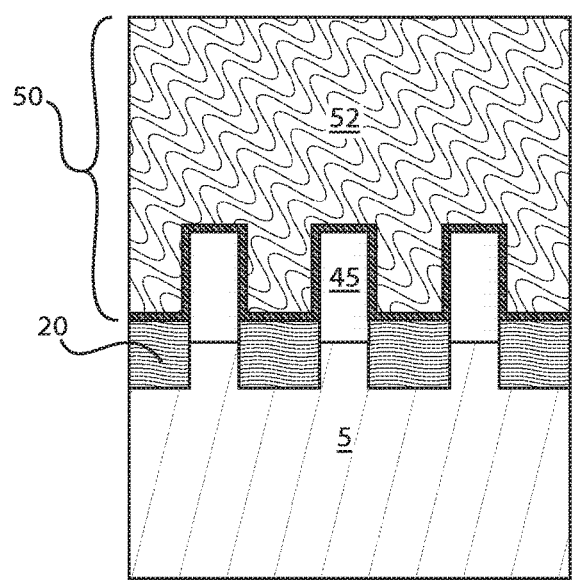
FIG. 8C is a side cross-sectional view along section line B-B' in FIG. 8A.

FIGS. 8A-8C depicting forming a function gate structure 50 for a FinFET device in the gate opening 21. The functional gate structure 50 includes a gate dielectric 51 and a gate conductor 52. The "functional gate structure" functions to switch the semiconductor device from an "on" to "off" state, and vice versa. The functional gates structure 50 is formed on the channel region of the active region portion of the fin structures, i.e., functional fin structures 45 of a second semiconductor material. The gate structure 50 typically includes at least a gate dielectric 51 that is present on the channel region of the fin structure 45 and a gate electrode 52 that is present on the gate dielectric 51.

In one embodiment, the at least one gate dielectric layer 51 includes, but is not limited to, an oxide, nitride, oxynitride and/or silicates including metal silicates, aluminates, titanates and nitrides. In some embodiments, the gate dielectric 51 may be composed of a high-k gate dielectric. The term "high-k", as used herein, denotes a dielectric constant that is greater than the dielectric constant of silicon oxide, which is typically equal to 3.9 (i.e., typically a silicon oxide) measured in vacuum at room temperature (20° C. to 25° C.). Some examples of high-k dielectric materials suitable for the high-k gate dielectric layer 51 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed for the high-k gate dielectric layer 51 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof. In one embodiment, the high-k gate dielectric layer 51 has a thickness that ranges from 1 nm to 10 nm. In another embodiment, the high-k gate dielectric layer 51 has a thickness that ranges from 1 nm to 4 nm. The thickness of the high-k gate dielectric layer 51 may be conformal.

In some embodiments, in which the gate sidewall spacer 55 has an undercut region 56 (also referred to as notch) present at the base portion of the spacer, the gate dielectric 51 includes a lateral extension 56 that fills the undercut region 56 in the gate sidewall spacers 55. In some embodiments, the gate dielectric 51 is a conformal layer including a horizontally orientated portion present on the channel region of the silicon and germanium containing fin structure 45, and a vertically orientated portion on interior sidewalls of the gate sidewalls spacers 55, wherein the horizontally orientated portions and the vertically orientated portions intersect at the portion of the gate dielectric including the lateral extension 56, as depicted in FIGS. 8A-8C.

The conductive material of the gate electrode 52 may comprise polysilicon, SiGe, a silicide, a metal or a metal-silicon-nitride such as Ta—Si—N. Examples of metals that can be used as the gate electrode 52 include, but are not limited to, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The layer of conductive material for the gate electrode 52 may be doped or undoped. If doped, an in-situ doping deposition process may be employed. Alternatively, a doped conductive material can be formed by deposition, ion implantation and annealing.

The gate electrode 52 may further include a workfunction layer. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

The various layers of the gate structure 50 may be formed by using a deposition method, such as an atomic layer deposition (ALD), a chemical vapor deposition (CVD) and/or a physical vapor deposition (PVD).

The process flow described with reference to FIGS. 1A-8C provides a FinFET semiconductor device including a silicon and germanium containing fin structure 45 epitaxially present atop a silicon substrate 5, wherein a base of the silicon germanium fin structure includes lateral extensions 46. A gate structure 50 present on a channel portion of the silicon and germanium containing fin structure 45; and source and drain regions 30, 35 are present on opposing sides of the channel portion of the silicon and germanium containing fin structure 45, wherein the lateral extensions 46 of the silicon and germanium containing fin structure undercut an edge of the source and drain regions 30, 35.

In some embodiments, the gate structure 50 further includes a gate dielectric 51 present on the channel portion of the silicon and germanium containing fin structure 45, a gate conductor 52 present on the gate dielectric 51. In some embodiments, gate sidewall spacers 55 are present on the sidewalls of the gate structure 50, wherein the gate sidewall spacers have a notch, i.e., undercut region 56, present at a base portion, and wherein said gate dielectric 51 includes a lateral extension 53 that fills the notch, i.e., undercut region 56, in the gate sidewall spacers. In some embodiments, the gate sidewall spacers comprise a two layer dielectric stack 15', 55 including the first material layer 15' that is laterally notched to provide said undercut region 56 that is present underlying a second material layer 55 that is present on the first material layer 15'.

The process flow described with reference to FIGS. 1A-8C is only one process flow for the methods of the present invention. The sequence, i.e., order of steps, depicted by the succession of FIGS. 1A-1C to FIGS. 8A-8C illustrates only one sequence for the process flow. Other embodiments have also been contemplated for the process sequence. For example, the process sequence for forming a FinFET device including a silicon germanium fin structure 45 may include the steps in an ordered sequence of: 1) forming a sacrificial gate structure 25 on a hardmask 15 overlying a channel region portion of the plurality of sacrificial fins 10 of a first semiconductor material; 2) forming source and drain regions 30, 35 on opposing sides of the channel region; 3) removing the sacrificial gate structure 25 and the sacrificial fin structure 10 selectively to the hardmask 15; 4) forming a second semiconductor material 45 in an opening provided by removing the sacrificial gate structure and the sacrificial fin structure; 5) etching the second semiconductor material 45 selectively to the hardmask 15 to provide a plurality of second semiconductor material fin structures 45; 6) forming isolation regions 20 between adjacent second semiconductor material fin structures 45 of said plurality of second semiconductor material fin structures; and 7) forming a functional gate structure 50 on a channel region portion of the plurality of second semiconductor material fin structures 45. This process flow is now described below with reference to FIGS. 9A-13C.

Figure 9A:
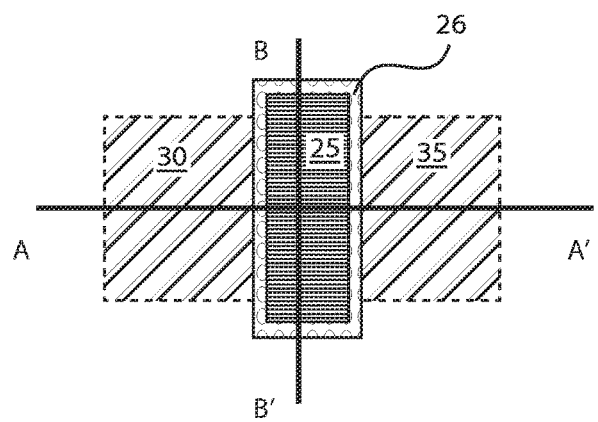
FIG. 9A is a top down view of an initial structure used for forming FinFET in accordance with a second embodiment of the present invention, in which the initial structure includes a sacrificial gate structure that is present on a channel region of fin structures of a first semiconductor material, wherein source and drain regions are on opposing sides of the channel region.
Figure 9B:
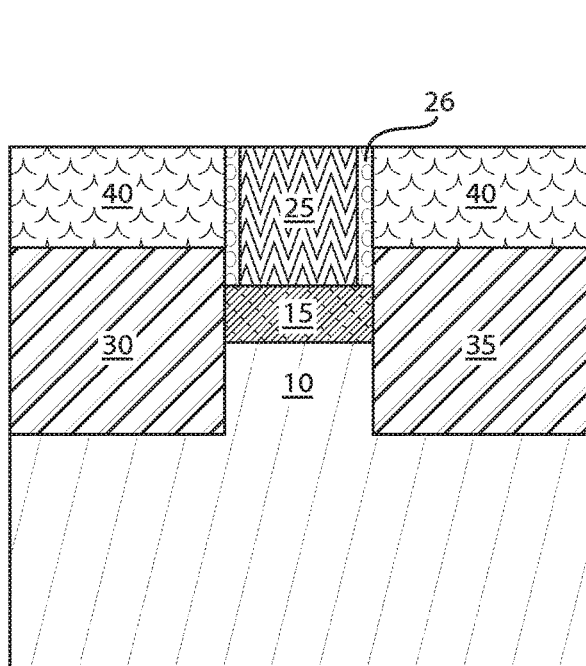
FIG. 9B is a side cross-sectional view along section line A-A' in FIG. 9A illustrating a cross section along a length of a fin structure.
Figure 9C:
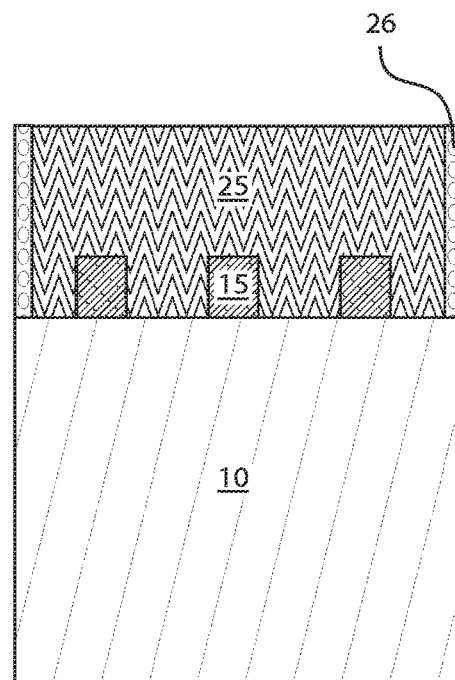
FIG. 9C is a side cross-sectional view along section line B-B' in FIG. 9A illustrate a cross section across the length of a plurality of fin structures.

FIGS. 9A-9C depicts one embodiment of an initial structure used for forming FinFET, in which the initial structure includes a sacrificial gate structure 25 that is present on a channel region of fin structures of a first semiconductor material 10, wherein source and drain regions 30, 35 are on opposing sides of the channel region. The initial structure depicted in FIGS. 9A-9C has been described above with reference to FIGS. 1A-3C. The description of the structures and methods relating to the structures having reference numbers in FIGS. 1A-3C is suitable for providing the description of the same structures having the same reference numbers in FIGS. 9A-9C. It is noted that in the embodiment depicted in FIGS. 9A-9C, the isolation regions 20 are not present.

Figure 10A:
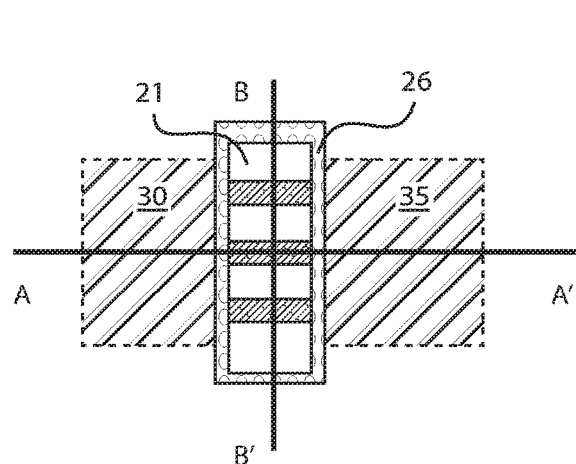
FIG. 10A is a top down view depicting one embodiment removing the sacrificial gate structure from the device structure depicted in FIG. 9A.
Figure 10B:
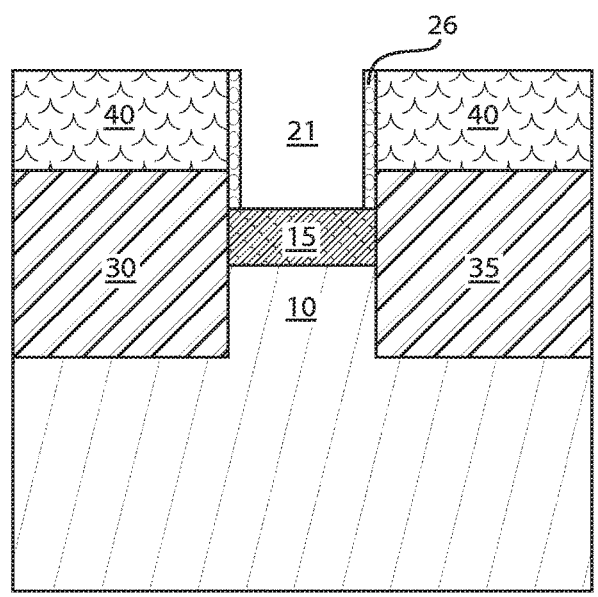
FIG. 10B is a side cross-sectional view along section line A-A' in FIG. 10A.
Figure 10C:
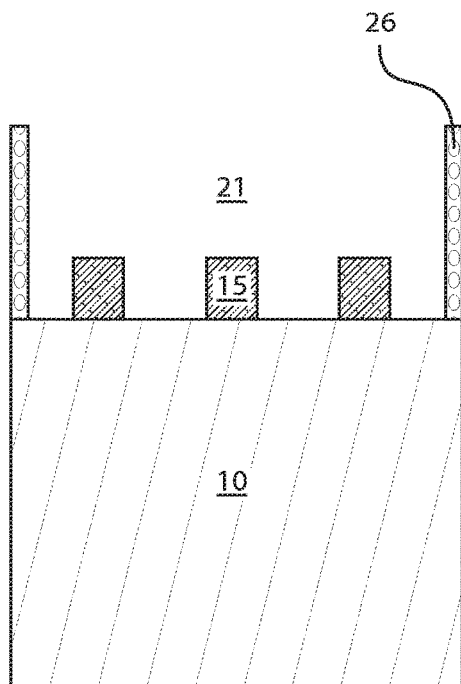
FIG. 10C is a side cross-sectional view along section line B-B' in FIG. 10A.

FIGS. 10A-10C depicting one embodiment removing the sacrificial gate structure 25 from the device structure depicted in FIGS. 9A-9C. This step is similar to the step of removing the sacrificial gate structure 25 that is described above with reference to FIGS. 3A-3C. Therefore, the above description of removing the sacrificial gate structure 25 in FIGS. 3A-3C is suitable for describing one embodiment of removing the sacrificial gate structure 25 as depicted in FIGS. 10A-10C.

Figure 11A:
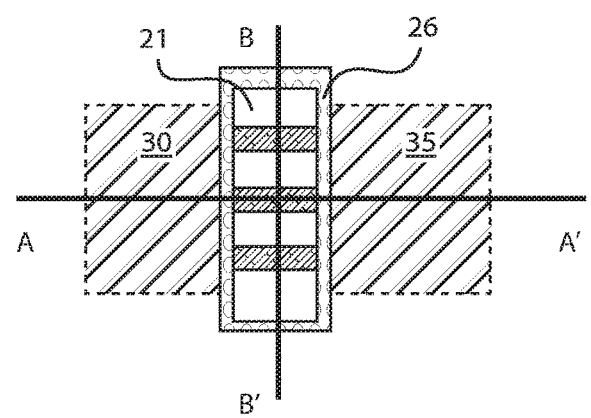
FIG. 11A is a top down view depicting isotropically etching the fin structures of the first semiconductor material that are depicted in FIG. 10A.
Figure 11B:
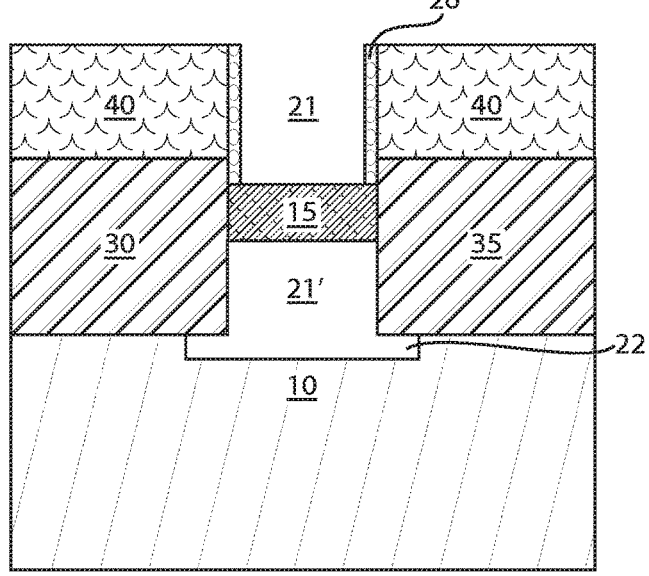
FIG. 11B is a side cross-sectional view along section line A-A' in FIG. 11A.
Figure 11C:
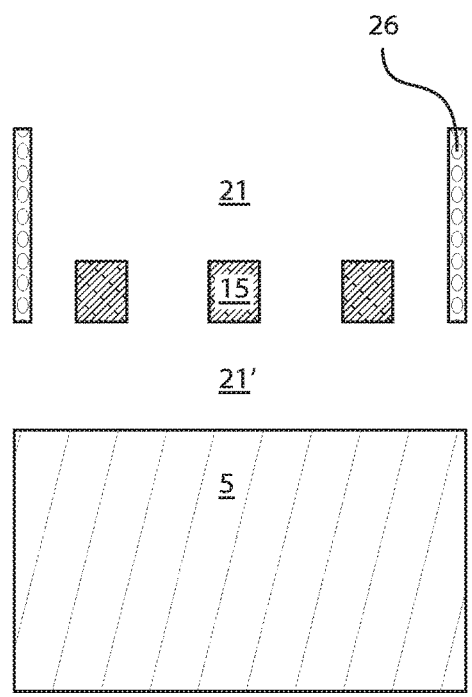
FIG. 11C is a side cross-sectional view along section line B-B' in FIG. 11A.

FIGS. 11A-11C depict isotropically etching the fin structures 10, i.e., removing the fin structures 10, of the first semiconductor material that are depicted in FIG. 10A. This step is similar to the step of removing the sacrificial fin structures 10 that are described above with reference to FIGS. 4A-4C. Therefore, the above description of removing the sacrificial fin structures in FIGS. 4A-4C is suitable for describing one embodiment of removing the sacrificial fin structures 10 as depicted in FIGS. 11A-11C.

FIGS. 12A-12C depicting epitaxially growing a second semiconductor material 45, e.g., silicon germanium (SiGe), in the opening provided by removing the sacrificial gate structure 25 and the sacrificial fin structure 10, and etching the second semiconductor material 45 selectively to the hardmask 15 to provide a plurality of second semiconductor material fin structures 45. These process steps have been described above with reference to FIGS. 5A-6C. The description of the structures and methods relating to the structures having reference numbers in FIGS. 5A-6C is suitable for providing the description of the same structures having the same reference numbers in FIGS. 12A-12C. It is noted that isolation regions 20 are not present in FIGS. 12A-12C, as well as not being present in any of the aforementioned steps.

FIGS. 13A-13C depicting forming isolation regions 20 between adjacent second semiconductor material fin structures 45. The isolation regions, i.e., shallow trench isolation (STI) regions 20 may be formed between adjacent silicon germanium fin structures 45 at the base of the silicon germanium fin structures 45. For example, isolation regions may be formed by depositing a dielectric in the trench that is separating the adjacent silicon germanium fin structures 45. The dielectric material for the isolation regions may be an oxide, such as silicon oxide. Other dielectric materials for the isolation regions may include nitride, such as silicon nitride, and/or silicon oxynitride materials, e.g., silicon oxynitride. The isolation regions may be formed using a chemical vapor deposition (CVD) process, such as plasma enhanced chemical vapor deposition (PECVD), metal organic chemical vapor deposition (MOCVD) and/or high density plasma chemical vapor deposition (HDPCVD). The height of the dielectric material for the shallow trench isolation (STI) regions 20 may be set using an etch process, such as reactive ion etching (RIE). It is noted that isolation region densification steps, such as high temperature annealing, may be omitted from the process flow described with reference to FIGS. 9A-13C.

In a following process step, a functional gate structure 50 may be formed on a channel region portion of the plurality of second semiconductor material fin structures 45 that are depicted in FIGS. 13A-13 C. The steps of forming the function gate structure 50, as well as the gate sidewall spacer 55, have been described above with reference to FIGS. 7A-8C. The process flow described with reference to FIGS. 9A-13C, as well as FIGS. 7A-8C provides a final FinFET device structure including a silicon germanium fin structure channel and function gate structure 50 that is the same as the final FinFET device structure that is provided by the method described above with reference to FIGS. 1A-8C.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
 a silicon and germanium containing fin structure epitaxially present atop a silicon substrate, wherein a base of the silicon germanium fin structure includes lateral extensions;
 a gate structure including a gate dielectric present on a channel portion of the silicon and germanium containing fin structure;
 source and drain regions on opposing sides of the channel portion of the silicon and germanium containing fin structure, wherein the lateral extensions of the silicon and germanium containing fin structure undercut an edge of the source and drain regions; and
 gate sidewall spacers present on sidewalls of the gate structure, wherein the gate sidewall spacers have a notch present at a base portion, and said gate dielectric includes a lateral extension that fills the notch in the gate sidewall spacers.

2. The semiconductor device of claim 1, wherein the gate dielectric present on the channel portion of the silicon and germanium containing fin structure, including a gate conductor present on the gate dielectric.

3. The semiconductor device of claim 1, wherein the gate sidewall spacers comprise a two layer dielectric stack including a first material layer that is laterally notched to provide said notch that is present underlying a second material layer that is present on the first material layer.

4. The semiconductor device of claim 1, wherein the gate dielectric is a conformal layer including a horizontally orientated portion present on the channel region of the silicon and germanium containing fin structure and a vertically orientated portion on interior sidewalls of the gate sidewalls spacers, wherein the horizontally orientated portions and the vertically orientated portions intersect at the portion of the gate dielectric including the lateral extension.

5. The semiconductor device of claim 1, further comprising isolation regions on opposing sides of the fin structure.

6. A semiconductor device comprising:
   a silicon and germanium containing semiconductor structure epitaxially present atop a silicon substrate, wherein a base of the silicon germanium semiconductor structure includes lateral extensions;
   a gate structure present on a channel portion of the silicon and germanium containing fin structure; and
   source and drain regions on opposing sides of a channel portion of the silicon and germanium containing semiconductor structure, wherein the lateral extensions of the silicon and germanium containing semiconductor structure undercut an edge of the source and drain regions, the source and drain regions having a planar base; and
   gate sidewall spacers present on sidewalls of the gate structure, wherein the gate sidewall spacers have a notch present at a base portion, and a gate dielectric of the gate structure includes a lateral extension that extends into the notch in the gate sidewall spacers.

7. The semiconductor device of claim 6, wherein the gate sidewall spacers comprise a two layer dielectric stack including a first material layer that is laterally notched to provide said notch that is present underlying a second material layer that is present on the first material layer.

8. The semiconductor device of claim 7, wherein a gate dielectric of the gate structure is a conformal layer including a horizontally orientated portion present on the channel region of the silicon and germanium containing semiconductor structure and a vertically orientated portion on interior sidewalls of the gate sidewalls spacers, wherein the horizontally orientated portions and the vertically orientated portions intersect at the portion of the gate dielectric including the lateral extension.

9. The semiconductor device of claim 6, further comprising isolation regions on opposing sides of the silicon and germanium containing semiconductor structure.

10. A semiconductor device comprising:
    a first semiconductor material fin structure epitaxially present atop a second semiconductor material substrate, wherein a base of the first semiconductor material fin structure includes lateral extensions;
    a gate structure present on a channel portion of the first semiconductor material fin structure;
    source and drain regions on opposing sides of the channel portion of the first semiconductor material containing fin structure, wherein the lateral extensions of the first semiconductor material containing fin structure undercut an edge of the source and drain regions, the source and drain regions having a planar base; and
    gate sidewall spacers present on sidewalls of the gate structure, wherein the gate sidewall spacers have a notch present at a base portion, and a gate dielectric of the gate structure includes a lateral extension that extends into the notch in the gate sidewall spacers.

11. The semiconductor device of claim 10, wherein the gate structure further includes a gate conductor present on the gate dielectric.

12. The semiconductor device of claim 10, further comprising isolation regions on opposing sides of the fin structure.

13. The semiconductor device of claim 11, wherein the first semiconductor material fin structure comprises silicon germanium.

* * * * *